US012598802B2

(12) United States Patent
Wu et al.

(10) Patent No.: US 12,598,802 B2
(45) Date of Patent: Apr. 7, 2026

(54) HIGH-VOLTAGE TOLERANT DEVICE AND DETECTION CIRCUIT

(71) Applicant: Leadtrend Technology Corporation, Zhubei City (TW)

(72) Inventors: Tsung-Chien Wu, Zhubei City (TW); Jhen-Hong Li, Zhubei City (TW); Chih-Wen Hsiung, Zhubei City (TW); Cheng-Sheng Kao, Zhubei City (TW)

(73) Assignee: LEADTREND TECHNOLOGY CORPORATION, Zhubei City (TW)

( * ) Notice: Subject to any disclaimer, the term of this patent is extended or adjusted under 35 U.S.C. 154(b) by 401 days.

(21) Appl. No.: 18/521,065

(22) Filed: Nov. 28, 2023

(65) Prior Publication Data

US 2024/0274600 A1 Aug. 15, 2024

(30) Foreign Application Priority Data

Feb. 13, 2023 (TW) ................................. 112105006

(51) Int. Cl.
| | |
|---|---|
| *H01L 27/088* | (2006.01) |
| *H01L 27/092* | (2006.01) |
| *H01L 29/08* | (2006.01) |
| *H01L 29/10* | (2006.01) |
| *H01L 29/78* | (2006.01) |
| *H10D 30/62* | (2025.01) |
| *H10D 62/13* | (2025.01) |
| *H10D 62/17* | (2025.01) |
| *H10D 84/00* | (2025.01) |
| *H10D 84/83* | (2025.01) |
| *H10D 84/85* | (2025.01) |

(52) U.S. Cl.
CPC ....... *H10D 84/834* (2025.01); *H10D 30/6211* (2025.01); *H10D 62/153* (2025.01); *H10D 62/157* (2025.01); *H10D 62/364* (2025.01); *H10D 84/151* (2025.01); *H10D 84/859* (2025.01)

(58) Field of Classification Search
CPC ............. H10D 84/834; H10D 30/6211; H10D 62/153; H10D 62/157; H10D 62/364; H10D 84/151; H10D 84/859; H10D 30/603
USPC ........................................................ 257/401
See application file for complete search history.

(56) References Cited

U.S. PATENT DOCUMENTS

| | | | | |
|---|---|---|---|---|
| 5,903,424 | A * | 5/1999 | Taillet ................. | H10D 89/713 |
| | | | | 361/111 |
| 2018/0315746 | A1* | 11/2018 | Patti ..................... | H10D 64/256 |
| 2022/0231165 | A1* | 7/2022 | Huang ................. | H10D 30/637 |

* cited by examiner

*Primary Examiner* — Tong-Ho Kim

(74) *Attorney, Agent, or Firm* — McClure, Qualey & Rodack, LLP

(57) ABSTRACT

Disclosed is a high-voltage device with ESD robustness. The high-voltage device is formed on a surface of a semiconductor substrate of a first type. A deep well of a second type opposite to the first type is formed on the surface. A filed isolation layer on the surface separates a drain active region from a source active region, and a control gate on top of the field isolation layer serves as a gate electrode of the high-voltage device. A first well of the second type at least partially overlaps the source active region, extends below the field isolation layer and at least partially overlaps the control gate. A buried layer of the first type at a bottom of the deep well has an extensive portion below the control gate. The deep well provides a conductive channel allowing current to flow from the drain active region to the source active region.

20 Claims, 5 Drawing Sheets

1

HIGH-VOLTAGE TOLERANT DEVICE AND DETECTION CIRCUIT

CROSS-REFERENCE TO RELATED APPLICATION

This application claims priority to and the benefit of Taiwan Application Series Number 112105006 filed on Feb. 13, 2023, which is incorporated by reference in its entirety.

BACKGROUND

The present disclosure relates generally to high-voltage semiconductor devices, and more particularly to high-voltage semiconductor devices and related detection circuits with designs improving ESD robustness.

To achieve fast computation and lightweight products, semiconductor products are often made with increasing precision, but they also become more fragile. However, semiconductor products often need to meet specific requirements for different application systems, particularly in their input and output ports, where they must deal with unique environmental conditions and have particular demands. For example, in high-power applications, some electronic devices operate in networks with switches, inductors, and capacitors, requiring the input and output ports of the electronic products to withstand momentary large fluctuations in voltage and current. These specification requirements pose new challenges for semiconductor device designers.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale. Likewise, the relative sizes of elements illustrated by the drawings may differ from the relative sizes depicted.

The invention can be more fully understood by the subsequent detailed description and examples with references made to the accompanying drawings, wherein.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure, or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures, or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
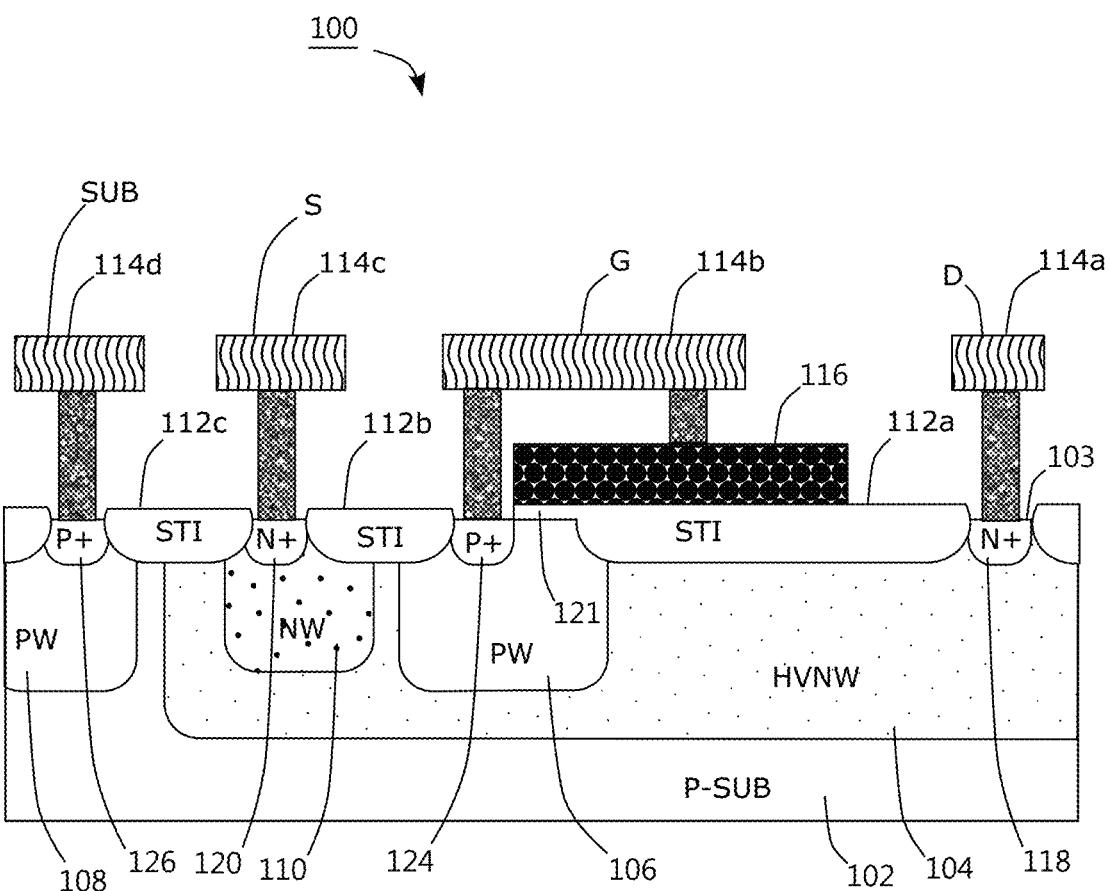
FIG. 1 illustrates a high-voltage device in the art.

FIG. 1 illustrates commonly known high-voltage device 100, equivalent to an N-channel junction field-effect transistor (JFET) formed on P-type substrate 102. High-voltage device 100 has drain electrode D, source electrode S, gate electrode G, and substrate electrode SUB. Drain electrode D of high-voltage device 100 can be considered a high-voltage terminal capable of withstanding high input voltages.

Formed on surface 103 of P-type substrate 102 are field isolation layers 112a, 112b, and 112c. Each field isolation layer serves to separate different active regions. Generally, formed within an active region can be gate structures and/or source/drain heavily doped layers that are needed for forming metal-oxide-semiconductor transistors. As shown in FIG. 1, field isolation layer 112a and gate insulating layer 121 separate P-type heavily doped layer 124 from N-type heavily doped layer 118. P-type heavily doped layer 124 acts as an electrical contact for P-type well 106, and N-type heavily doped layer 118 does as an electrical contact for N-type deep well 104 on the right side. Field isolation layer 112b is formed between P-type heavily doped layer 124 and N-type heavily doped layer 120. N-type heavily doped layer 120 and the N-type well 110 as a whole is another electrical contact for N-type deep well 104 on the left side. Field isolation layer 112c separates N-type heavily doped layer 120 from P-type heavily doped layer 126. P-type heavily doped layer 126 and P-type well 108 together act as an electrical contact for P-type substrate 102.

An interconnection in this specification may refer to various conductive elements such as metal wires, plugs, and vias used for electrical connections between semiconductor parts or semiconductor devices. In FIG. 1, interconnection 114a forms an ohmic contact with the N-type heavily doped layer 118, serving as drain electrode D of high-voltage device 100. Interconnection 114b electrically connects polysilicon layer 116 with P-type heavily doped layer 124, serving as gate electrode G of high-voltage device 100. Interconnection 114c forms an ohmic contact with N-type heavily doped layer 120, serving as source electrode S of high-voltage device 100. Interconnection 114d forms an ohmic contact with P-type heavily doped layer 126, serving as substrate electrode SUB that connects to P-type substrate 102.

Gate-to-source voltage $V_{GS}$ applied between gate electrode G and source electrode S controls the width of the depletion region in the PN junction between P-type well 106 and N-type deep well 104. This, in turn, controls the conductive channel that N-type deep well 104 provides to connect N-type heavily doped layer 118 with N-type well 110. Polysilicon layer 116 located on gate oxide layer 121 and field isolation layer 112a can act as a field plate, allowing for fine adjustment of the electric field distribution within N-type deep well 104, thereby enhancing the drain-to-source breakdown voltage of high-voltage device 100.

High-voltage device 100 in FIG. 1 may have an issue known as gate leakage. During circuit operation, when drain-to-gate voltage $V_{DG}$ exhibits a large negative voltage, the PN junction between P-type well 106 and N-type deep well 104 becomes forward biased, resulting in a significant current flowing from gate electrode G to drain electrode D. This is known as gate leakage. Gate leakage is not allowed in certain circuit applications.

Figure 2A:
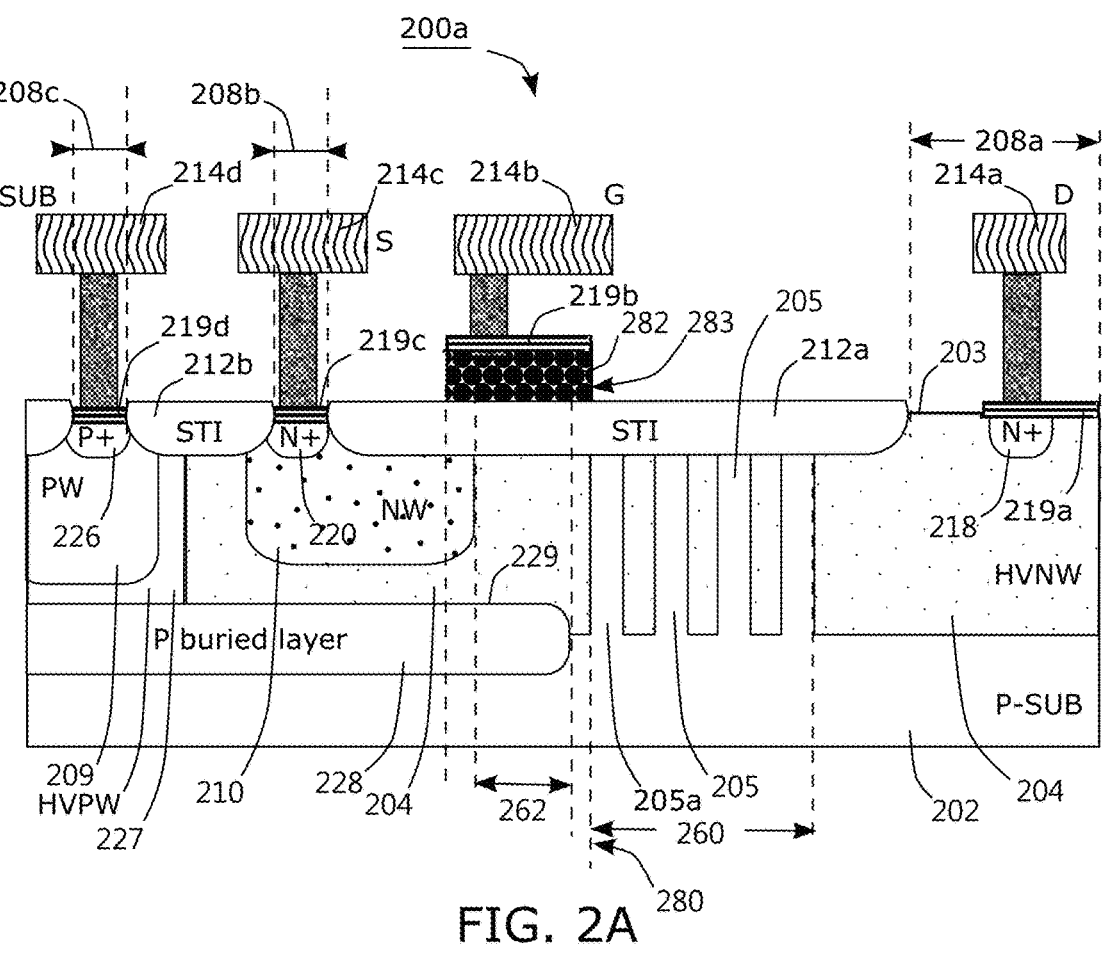
FIGS. 2A to 2C illustrate high-voltage devices according to embodiments of the invention.

FIG. 2A illustrates high-voltage device 200a, a controllable depletion-mode semiconductor device according to an embodiment of the present invention. Generally, high-voltage device 200a is a depletion-mode NMOS transistor with field isolation layer 212a used as a gate oxide. The same or similar aspects between high-voltage device 200a and high-voltage device 100 can be understood through previous explanations for high-voltage device 100, and will not be repeated here.

P-type substrate 202 with upper surface 203 might include an epitaxial layer, in which P-type buried layer 228 is embedded. For example, in the case of a blank (unpatterned) P-type virgin wafer, P-type dopants can be implanted at the desired locations for P-type buried layer 228, followed by epitaxial growth on top, effectively increasing the thickness of the wafer, to form P-type substrate 202 with P-type buried layer 228. Alternatively, in other embodiments of the present invention, P-type buried layer 228 can be formed by implanting P-type dopants at desired locations with desired depth after the epitaxial growth. For the sake of convenience in explanation, the direction that upper surface 203 of the P-type substrate 202 faces is referred to as the "upward" direction, while the opposite direction is referred to as the "downward" direction.

On upper surface 203, field isolation layer 212a separates drain active region 208a from source active region 208b, while field isolation layer 212b separates source active region 208b from substrate active region 208c. N-type heavily doped layers 218 and 220 are located within drain active region 208a and source active region 208b, respectively, serving as the electrical contacts for N-type deep well 204 on the right and left sides. P-type heavily doped layer 226 is located within substrate active region 208c and is electrically connected to P-type substrate 202 through P-type well 209, P-type deep well 227, and P-type buried layer 228. P-type deep well 227 is formed on surface 203, contacting both P-type well 209 and P-type buried layer 228. Polysilicon layer 282 serves as a control gate and is formed on top of field isolation layer 212a. Each field isolation layer, for example, can be formed using a shallow trench isolation process or a field oxidation process, creating isolation structures on upper surface 203.

Interconnection 214a serves as drain electrode D of high-voltage device 200a, making ohmic contact with salicide 219a, which forms an ohmic contact with N-type heavily doped layer 218. Salicide 219a does not make direct contact with field isolation layer 212a and is separated by a certain distance, as shown in FIG. 2A. Interconnection 214b serves as gate electrode G of high-voltage device 200a, making contact with salicide 219b and/or polysilicon layer 282. Interconnection 214c serves as source electrode S of high-voltage device 200a, making ohmic contact with salicide 219c on N-type heavily doped layer 220. Interconnection 214d serves as substrate electrode SUB of high-voltage device 200a, making ohmic contact with salicide 219d, which forms an ohmic contact with P-type heavily doped layer 226.

From FIG. 2A, it can be observed that N-type deep well 204 provides a conductive channel that allows current to flow from drain electrode D, through N-type heavily doped layer 218, across N-type deep well 204 and N-type well 210 beneath field isolation layer 212a, and to N-type heavily doped layer 220, ultimately reaching source electrode S. This conductive channel can be controlled by gate-to-source voltage $V_{GS}$ applied between gate electrode G and source electrode S. When gate-to-source voltage $V_{GS}$ is negative, a depletion region where electrons and holes are depleted may be formed in N-type deep well 204 near field isolation layer 212a, below polysilicon layer 282, and the more negative gate-to-source voltage VGS the thicker depletion region. Another depletion region is formed at the PN junction between P-type buried layer 228 and N-type deep well 204. Once these two depleted regions pinch, this conductive channel within the N-type deep well 204 is closed. Since high-voltage device 200a is normally in the conducting state without applying a voltage, it is a controllable depletion-mode semiconductor device.

N-type deep well 204 contains ultra-lightly-doped portion 260 below field isolation layer 212a and between polysilicon layer 282 and drain active region 208a. Within ultra-lightly-doped portion 260, there are several non-implanted regions 205. These non-implanted regions 205 are intentionally left to reduce the doping concentration of ultra-lightly-doped portion 260, thereby increasing the breakdown voltage between the drain and source of high-voltage device 200a and allowing it to withstand higher voltages. For example, during an implantation process using a mask to introduce impurities that could convert P-type substrate 202 into N-type deep well 204, narrow, non-implanted regions 205 are shielded by the mask, preventing P-type substrate 202 within non-implanted regions 205 from being doped. After some thermal processing, nevertheless, non-implanted regions 205 and adjacent portion of doped regions merge and become ultra-lightly-doped portion 260 due to impurity diffusion from adjacent doped regions, serving as a portion of N-type deep well 204. Accordingly, the average impurity concentration of ultra-lightly-doped portion 260, even though it is a portion of N-type deep well 204, is less than that of other portions of N-type deep well 204 without non-implanted regions 205. For example, the average impurity concentration of ultra-lightly-doped portion 260 is less than that of the portion of N-type deep well within drain active region 208a. Non-implanted region 205a has shielding boundary 280, which is the most left edge of all non-implanted regions 205 shown in FIG. 2A. Polysilicon layer 282 has wire boundary 283, which is the edge of polysilicon layer 282 closest to drain active region 208a. In one embodiment, shielding boundary 280 is approximately aligned with wire boundary 283. In another embodiment, shielding boundary 280 is right below and within polysilicon layer 282, meaning that polysilicon layer 282 overlaps a portion of non-implanted regions 205 from a top view.

As shown in FIG. 2A, P-type buried layer 228 is embedded within P-type substrate 202, extending from below P-type deep well 227 all the way to bottom 229 of N-type deep well 204, to have extensive portion 262. Extensive portion 262 of P-type buried layer 228 is located below polysilicon layer 282 but not below N-type well 210, allowing it to induce a depletion region within N-type deep well 204. The extent of overlap between extensive portion 262 and polysilicon layer 282 can determine the threshold voltage of high-voltage device 200a. In FIG. 2A, extensive portion 262 does not extend beyond wire boundary 283 of polysilicon layer 282, and is totally covered by polysilicon layer 282.

In FIG. 2A, source active region 208b at least partially overlaps N-type well 210, which extends below field isolation layer 212a and partially overlaps polysilicon layer 282. N-type well 210 helps reduce the conduction resistance from drain electrode D to source electrode S when high-voltage device 200a is in a conducting state.

In some applications, substrate electrode SUB is connected to the ground potential of a circuit system, which is commonly referred to as 0V, and used as a reference ground potential.

Compared to high-voltage device 100 in FIG. 1, high-voltage device 200a in FIG. 2A is less likely to be damaged when drain electrode D experiences a large negative voltage. When drain electrode D in FIG. 2A experiences a large negative voltage, gate electrode G is isolated by field isolation layer 212a and no reverse current happens. However, in FIG. 1, the gate driver (not shown) that drives gate electrode G of high-voltage device 100 may be damaged as it will experience a large reverse current flowing through the forward-biased junction between P-type well 106 and N-type deep well 104.

Compared to high-voltage device 100 in FIG. 1, high-voltage device 200a in FIG. 2A may also have better ESD robustness when drain electrode D experiences ESD positive voltage discharge to substrate electrode SUB. In some applications, substrate electrode SUB is shorted to gate electrode G. Therefore, during the ESD testing where drain D experiences ESD positive voltage in reference to substrate electrode SUB, the most vulnerable area for breakdown in high-voltage device 100 in FIG. 1 is the PN junction between P-type well 106 and N-type deep well 104, particularly the PN junction close to the surface just beneath and near field isolation layer 112a. In contrast, for the same positive voltage ESD testing, the most vulnerable area for breakdown in high-voltage device 200a in FIG. 2A would be the PN junction between P-type buried layer 228 and N-type deep well 204, particularly the PN junction closest to drain electrode D. Comparatively, high-voltage device 200a is more robust because its vulnerable area is buried deep under N-type deep well 204 instead of being at the surface, allowing for better heat dissipation. This most vulnerable area for breakdown in high-voltage device 200a in FIG. 2A also enjoys higher breakdown voltage because of the existence of ultra-lightly-doped portion 260, which reduces the electric field variation at the PN junction between P-type buried layer 228 and (N-type) ultra-lightly-doped portion 260.

Figure 2B:
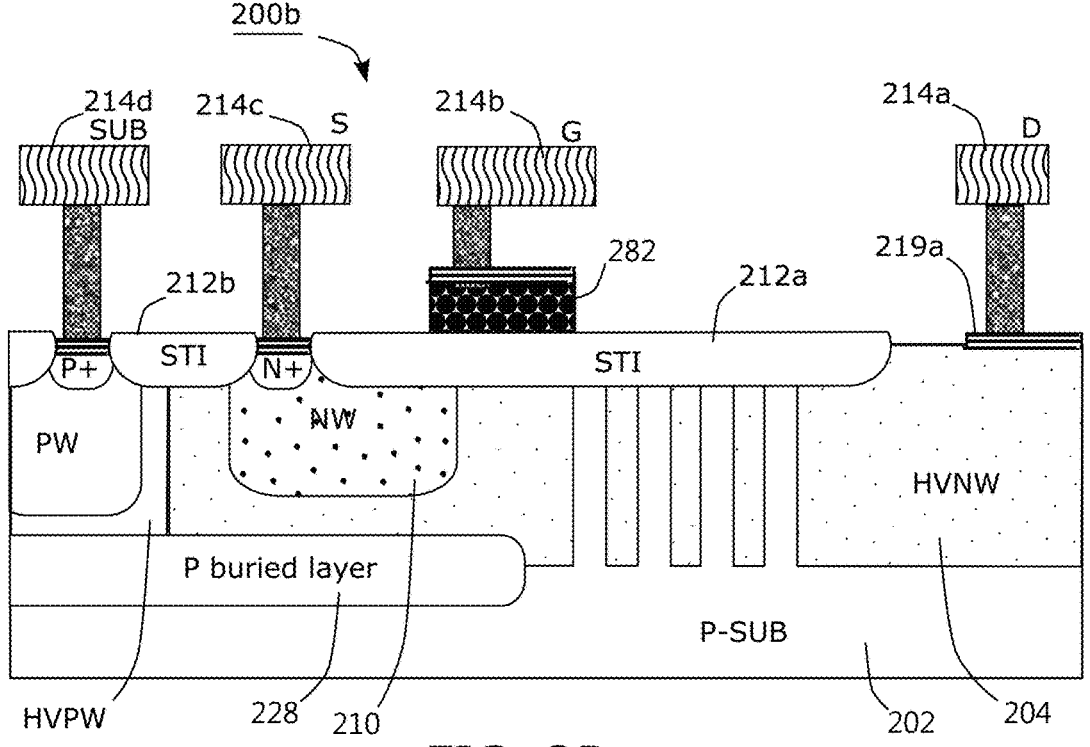

FIG. 2B illustrates high-voltage device 200b according to embodiments of the invention and is also a controllable depletion-mode semiconductor device. Some components or features in FIG. 2B have similarities or are identical to the corresponding components or features in FIG. 2A, and therefore, they will not be reiterated in view of the previous teaching of FIG. 2A. Unlike FIG. 2A, high-voltage device 200b in FIG. 2B does not have N-type heavily doped layer 218 present in high-voltage device 200a of FIG. 2A. In high-voltage device 200b, salicide 219a and N-type deep well 204 will form a Schottky junction, creating a rectifying Schottky diode between drain electrode D and N-type deep well 204. This Schottky diode may block reverse current flow from N-type deep well 204 to drain electrode D when a large negative voltage appears at drain electrode D.

Figure 2C:
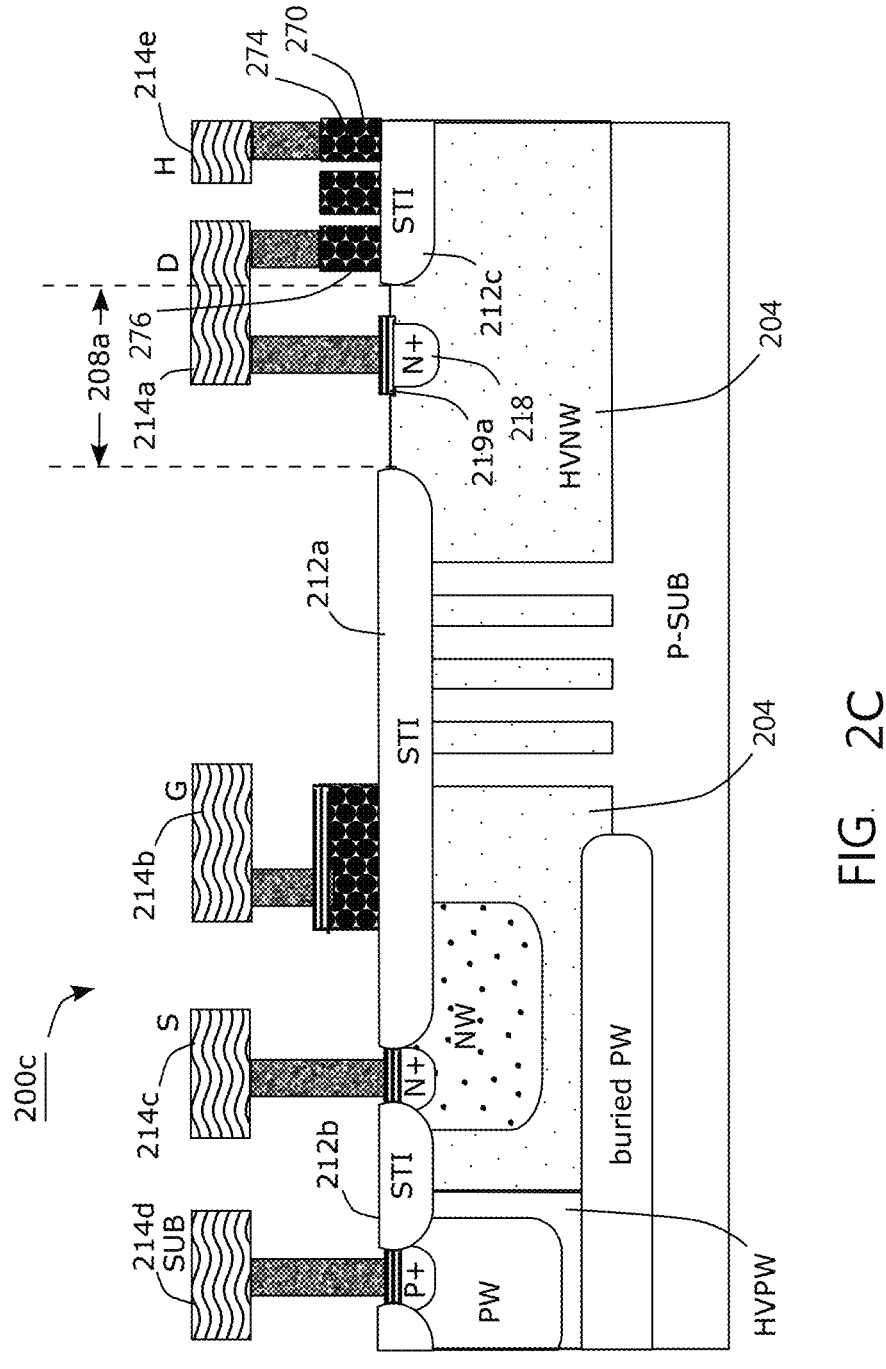

According to embodiments of the invention, FIG. 2C shows high-voltage device 200c, another controllable depletion-mode semiconductor device. Some components or features in FIG. 2C are similar or identical to the corresponding components or features in FIG. 2A, and therefore they will not be reiterated in view of the previous teaching. Unlike FIG. 2A, high-voltage device 200c in FIG. 2C additionally has field isolation layer 212c, and drain active region 208a is located between field isolation layers 212a and 212c. Above field isolation layer 212c, resistor structure 270 is formed to provide a resistor in the form of a patterned high-resistance polysilicon layer. One terminal 276 of resistor structure 270 is electrically connected to drain electrode D and salicide 219a via interconnection 214a, while the other terminal 274 is electrically connected to interconnection 214e, serving as high-voltage node H.

Figures 3A, 3B, 3C:
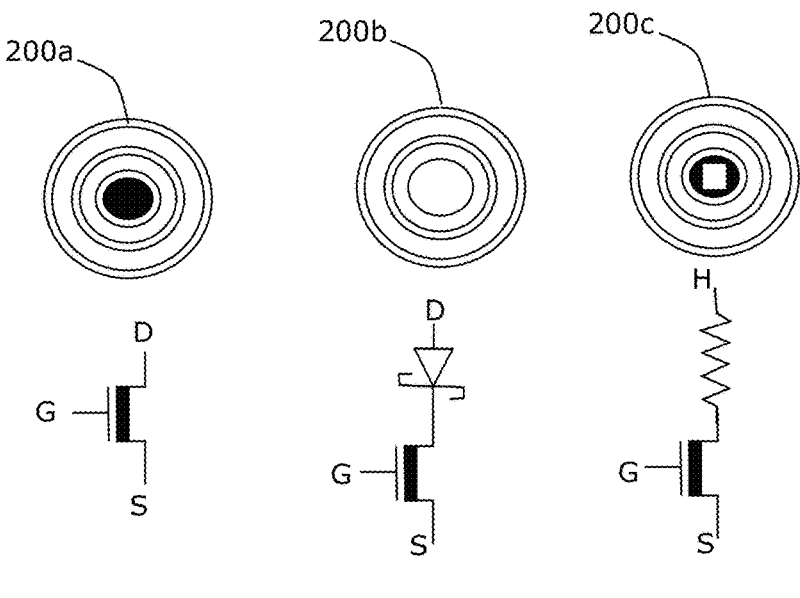
FIGS. 3A to 3C respectively show the top view representations and individual equivalent circuit diagrams of the high-voltage devices in FIGS. 2A to 2C.

According to some embodiments, in a top view, each of high-voltage devices 200a to 200c in FIGS. 2A to 2C approximately has a circular appearance. Taking FIG. 2A as an example, field isolation layer 212b in a top view forms an outer ring that surrounds or circles the inner ring formed by field isolation layer 212a, while drain active region 208a is at the center of the outer and inner rings. FIGS. 3A to 3C respectively show the top view representations and individual equivalent circuit diagrams of high-voltage devices 200a to 200c. FIG. 3A shows that high-voltage device 200a is equivalent to a depletion-mode NMOS transistor. FIG. 3B shows that high-voltage device 200b is equivalent to a depletion-mode NMOS transistor and a Schottky diode connected in series. FIG. 3C shows that high-voltage device 200c is equivalent to a depletion-mode NMOS transistor and a resistor connected in series.

Figure 4:
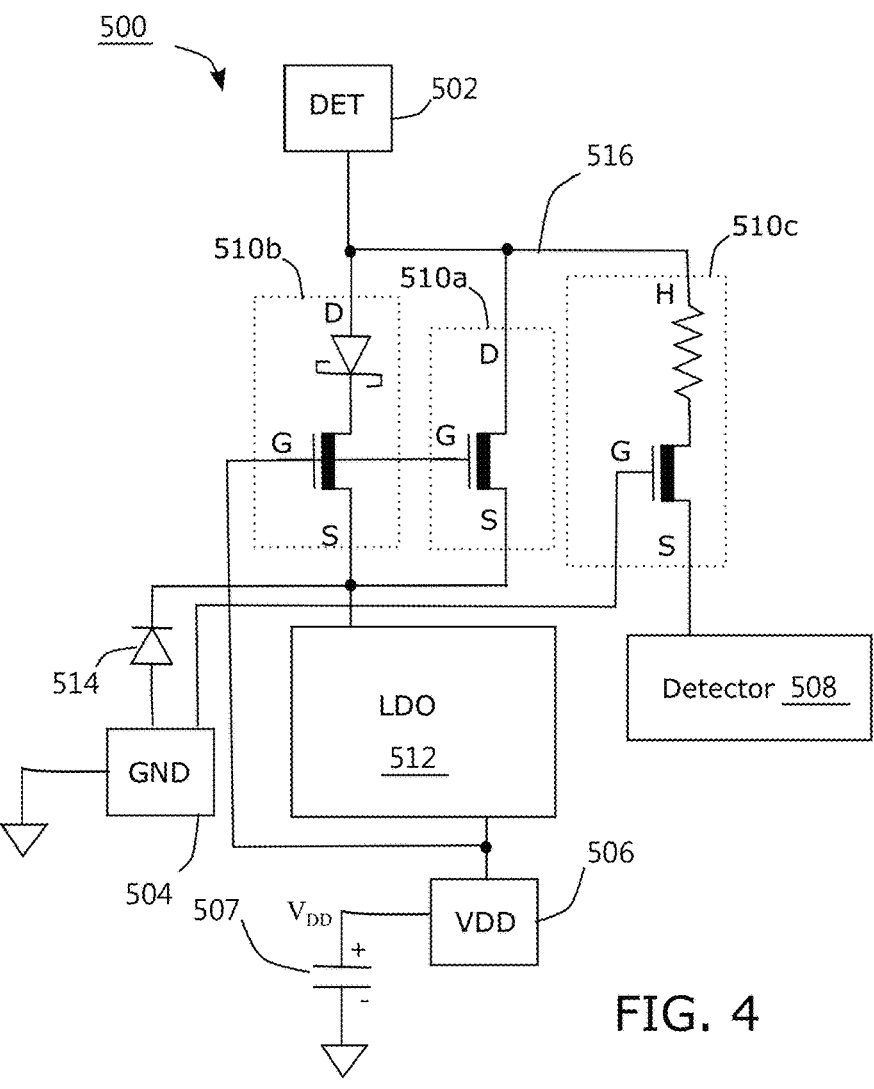
FIG. 4 shows a detection circuit with high-voltage devices according to embodiments of the invention.

FIG. 4 shows detection circuit 500 with high-voltage devices 200a to 200c according to embodiments of the invention. Detection circuit 500 is, for example, an integrated circuit formed on P-type substrate 202, including detection bonding pad 502, ground bonding pad 504, VDD power source bonding pad 506, depletion-mode semiconductor devices 510a to 510c, low-dropout regulator 512, detector 508, and diode 514, interconnected as shown in FIG. 4. Source electrodes S of depletion-mode semiconductor devices 510a and 510b are connected to an input of low-dropout regulator 512, and the output of low-dropout regulator 512 is connected to VDD power source bonding pad 506. P-type substrate 202 is electrically connected to ground bonding pad 504, and the voltage at P-type substrate 202 or ground bonding pad 504 is normally deemed as 0V. Depletion-mode semiconductor devices 510a to 510c are constructed using high-voltage devices 200a to 200c shown in FIGS. 2A to 2C, respectively. As shown in FIG. 2C, high-voltage device 200c includes a resistor formed by resistor structure 270, which high-voltage device 200a in FIG. 2A lacks. Drain electrodes D of depletion-mode semiconductor devices 510a and 510b, as well as high-voltage node H of depletion-mode semiconductor device 510c, all can be considered as high-voltage terminals and are electrically connected to detection bonding pad 502 through interconnection 516. Gate electrodes G of depletion-mode semiconductor devices 510a and 510b are connected to an output of LDO 512, while gate electrode G of depletion-mode semiconductor device 510c is connected to ground bonding pad 504.

When detection bonding pad 502 experiences a positive voltage relative to the voltage at ground bonding pad 504, depletion-mode semiconductor devices 510a and 510b, as well as low-dropout regulator 512, can collectively conduct current from detection bonding pad 502 to charge capacitor

507 connected to VDD power supply bonding pad 506, thereby building up operational power supply $V_{DD}$ on capacitor 507.

When detection bonding pad 502 experiences a small negative voltage relative to the voltage at ground bonding pad 504 (not more negative than –0.7V), the Schottky diode in depletion-mode semiconductor device 510*b* blocks the occurrence of reverse current. Low-dropout regulator 512 and diode 514 also provide some level of protection against reverse current. Depletion-mode semiconductor device 510*c* dominantly supplies a small reverse current to detection bonding pad 502, so detector 508 can detect this small negative voltage appearing on detection bonding pad 502.

When detection bonding pad 502 experiences a large negative voltage relative to the voltage at ground bonding pad 504, the Schottky diode in depletion-mode semiconductor device 510*b* still blocks the occurrence of reverse current. Depletion-mode semiconductor device 510*a* and diode 514 can provide a large reverse current to detection bonding pad 502, while depletion-mode semiconductor device 510*c* provides a relatively smaller reverse current due to the resistance of the resistor in depletion-mode semiconductor device 510*c*. As a result, the resistor embedded within the depletion-mode semiconductor device 510*c* is less likely to be damaged. Therefore, detection circuit 500 is capable of withstanding reverse current impact.

Figure 5:
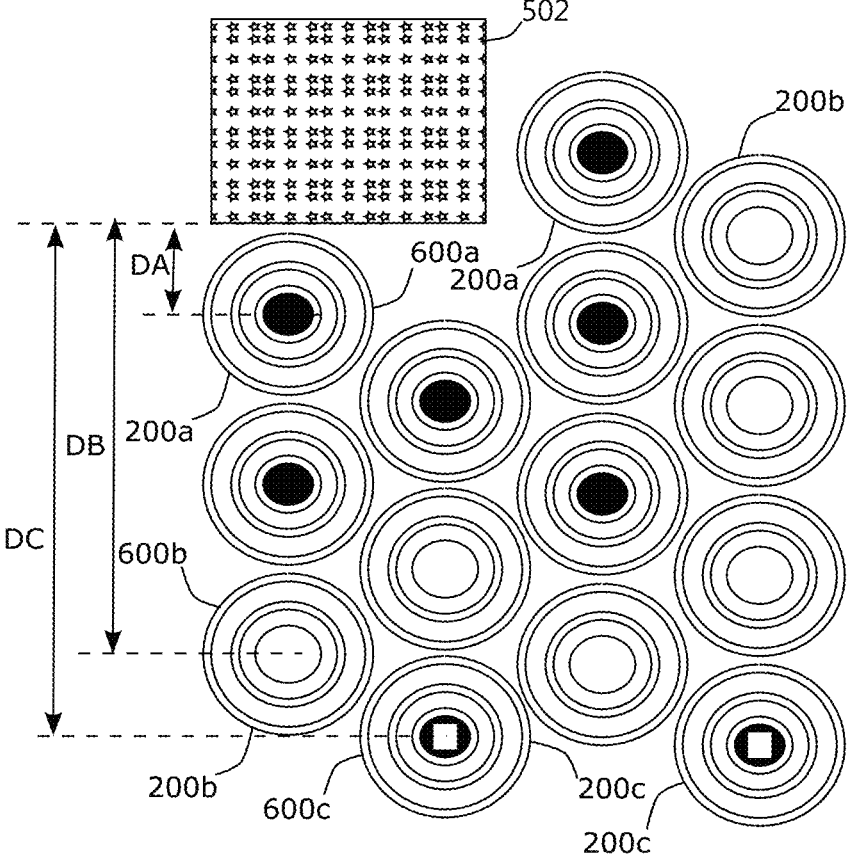
FIG. 5 illustrates a top view of the detection circuit in FIG. 4.

FIG. 5 illustrates a top view of detection circuit 500, which comprises detection bonding pad 502, six high-voltage devices 200*a* (forming depletion-mode semiconductor device 510*a*), six high-voltage devices 200*b* (forming depletion-mode semiconductor device 510*b*), and two high-voltage devices 200*c* (forming depletion-mode semiconductor device 510*c*), distributed and located on P-type substrate 202 shown in FIG. 5. The structures of high-voltage devices 200*a*, 200*b*, and 200*c* are taught and shown previously in FIGS. 2A-2C.

As shown in FIG. 5, for example, high-voltage devices 600*a* to 600*c* correspond to high-voltage devices 200*a* to 200*c* respectively, having corresponding distances DA, DB, and DC between them and detection bonding pad 502. Each of distances DA, DB, and DC is from the center of a corresponding high-voltage device to the closest edge of detection bonding pad 502, as shown in FIG. 5. Distance DC is greater than distance DB, which is greater than distance DA. Placing high-voltage device 600*a* closer to detection bonding pad 502 compared to high-voltage device 600*c* allows high-voltage device 600*a* to quickly respond and provide a larger reverse current when a large negative ESD voltage occurs at detection bonding pad 502 than high-voltage device 600*c* does. This arrangement could prevent damage to the resistor in high-voltage device 600*c* probably caused by the stress of the large negative ESD voltage, and enhances the ability of detection circuit 500 to withstand the large negative ESD voltage.

While the invention has been described by way of examples and in terms of preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage device, comprising:
a semiconductor substrate of a first type, having a surface;
a deep well of a second type formed on the surface, wherein the second type is opposite to the first type;

a field isolation layer formed on the surface and above the deep well, separating a drain active region from a source active region;
a control gate formed on top of the field isolation layer, serving as a gate electrode of the high-voltage device;
a first well of the second type, wherein the source active region at least partially overlaps the first well, the first well extends below the field isolation layer, and the first well at least partially overlaps the control gate; and
a buried layer of the first type embedded within the semiconductor substrate, formed at a bottom of the deep well and having an extensive portion below the control gate;
wherein the deep well provides a conductive channel that allows current to flow from the drain active region, and across the deep well and the first well beneath the field isolation layer, reaching the source active region.

2. The high-voltage device of claim 1, wherein the extensive portion is not below the first well, and is totally covered by the control gate.

3. The high-voltage device of claim 1, further comprising a second well of the first type formed on the surface, wherein the first well is between the second well and the drain active region, and the second well is electrically connected to the buried layer.

4. The high-voltage device of claim 3, wherein the deep well is a first deep well, and the high-voltage device comprises a second deep well of the first type contacting the second well and the buried layer.

5. The high-voltage device of claim 3, wherein the field isolation layer is a first field isolation layer, and the high-voltage device comprises a second field isolation layer separating the source active region from a substrate active region at least partially overlapping the second well.

6. The high-voltage device of claim 1, wherein the deep well includes an ultra-lightly-doped portion below the field isolation layer and between the control gate and the drain active region, and the ultra-lightly-doped portion has an average impurity concentration less than that of a portion of the deep well with the drain active region.

7. The high-voltage device of claim 6, wherein the ultra-lightly-doped portion includes non-implanted regions within which the semiconductor substrate is not doped when introducing impurities for converting the semiconductor substrate into the deep well.

8. The high-voltage device of claim 7, wherein the non-implanted regions have a shielding boundary, the control gate has a wire boundary, and the shielding boundary is substantially aligned with the wire boundary.

9. The high-voltage device of claim 8, wherein the extensive portion does not extend beyond the wire boundary of the control gate.

10. The high-voltage device of claim 1, wherein a salicide is formed within the drain active region and does not contact the field isolation layer.

11. The high-voltage device of claim 10, further comprising a doped layer of the second type within the drain active region, contacting with the salicide to form an ohmic contact.

12. The high-voltage device of claim 10, the field isolation layer is a first field isolation layer, and the high-voltage device further comprises a second field isolation layer and a resistor structure, the drain active region is located between the first and second field isolation layers, and the resistor structure is formed on top of the second field isolation layer, having a terminal electrically connected to the silicide via an interconnection.

13. A detection circuit capable of withstanding reverse current impact, formed on a substrate, comprising:

a detection bonding pad on the substrate;

a first controllable depletion-mode semiconductor device embedded with a first resistor, wherein the first resister has a first high-voltage node electrically connected to the detection bonding pad through an interconnection; and a second controllable depletion-mode semiconductor device without the first resistor, the second controllable depletion-mode semiconductor device has a second high-voltage node electrically connected to the detection bonding pad through the interconnection;

wherein, in a top view of the substrate, the first and second controllable depletion-mode semiconductor devices are first and second distances away from the detection bonding pad respectively, and the first distance is greater than the second distance.

14. The detection circuit as claimed in claim 13, wherein when a negative voltage relative to the voltage at the substrate occurs at the detection bonding pad the first and second controllable depletion-mode semiconductor devices provide first and second reverse currents, and the second reverse current is larger than the first reverse current.

15. The detection circuit as claimed in claim 13, further comprising:

a low-dropout regulator connected to the second controllable depletion-mode semiconductor device for conducting current from the detection bonding pad to build up an operational power supply.

16. The detection circuit as claimed in claim 15, wherein the second controllable depletion-mode semiconductor device has a gate electrode connected to an output of the low-dropout regulator.

17. The detection circuit as claimed in claim 13, further comprising a detector connected to a source electrode of the first controllable depletion-mode semiconductor device, and the detector is for detecting a negative voltage occurring at the detection bonding pad while the voltage at the substrate is deemed as 0V.

18. The detection circuit as claimed in claim 13, further comprising:

a third controllable depletion-mode semiconductor device without the first resistor, having a through high-voltage node electrically connected to the detection bonding pad through the interconnection;

wherein when a negative voltage relative to the voltage at the substrate occurs at the detection bonding pad the first and second controllable depletion-mode semiconductor devices provide first and second reverse currents, the second reverse current is larger than the first reverse current, and the third controllable depletion-mode semiconductor substantially provides no reverse current.

19. The detection circuit as claimed in claim 18, wherein in the top view of the substrate, the third controllable depletion-mode semiconductor device is a third distance away from the detection bonding pad, and the third distance is between the first and second distances.

20. The detection circuit as claimed in claim 13, wherein the substrate is of a first type, and each of the first and second controllable depletion-mode semiconductor devices comprises:

a deep well of a second type formed on a surface of the substrate, wherein the second type is opposite to the first type;

a field isolation layer formed on the surface and above the deep well, separating a drain active region from a source active region;

a control gate formed on top of the field isolation layer, serving as a gate electrode;

a first well of the second type, wherein the source active region at least partially overlaps the first well, the first well extends below the field isolation layer, and the first well at least partially overlaps the control gate; and a buried layer of the first type embedded within the substrate, formed at a bottom of the deep well and having an extensive portion below the control gate;

wherein the deep well provides a conductive channel that allows current to flow from the drain active region, and across the deep well and the first well beneath the field isolation layer, reaching the source active region; and a voltage at the gate electrode is capable of closing the conductive channel.

* * * * *